United States Patent
Feng et al.

(10) Patent No.: US 7,481,910 B2
(45) Date of Patent: Jan. 27, 2009

(54) METHOD AND APPARATUS FOR STABILIZING PLATING FILM IMPURITIES

(75) Inventors: Hsien-Ping Feng, Yonghe (TW); Ming-Yuang Cheng, Taipei (TW); Si-Kwua Cheng, Hsinchu (TW); Steven Lin, Hsih-Chu (TW); Jung-Chih Tsao, Taipei (TW); Chen-Peng Fan, Sinfong Township, Hsinchu County (TW); Chi-Wen Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 624 days.

(21) Appl. No.: 10/880,675

(22) Filed: Jun. 30, 2004

(65) Prior Publication Data

US 2006/0000717 A1   Jan. 5, 2006

(51) Int. Cl.
*C25D 17/00* (2006.01)
*B01D 29/56* (2006.01)

(52) U.S. Cl. .................. 204/238; 204/240; 210/194; 210/196; 210/335

(58) Field of Classification Search .................. 204/99, 204/101; 205/480, 482, 403.06
See application file for complete search history.

(56) References Cited

U.S. PATENT DOCUMENTS

| | | | | |
|---|---|---|---|---|
| 3,663,407 A | * | 5/1972 | Loop et al. | 204/482 |
| 4,816,162 A | * | 3/1989 | Rosskopf et al. | 210/651 |
| 6,200,436 B1 | * | 3/2001 | Woo | 204/238 |
| 6,254,760 B1 | * | 7/2001 | Shen et al. | 205/335 |
| 6,379,520 B1 | * | 4/2002 | Kuriyama et al. | 205/81 |
| 6,406,608 B1 | * | 6/2002 | Uzoh et al. | 205/101 |

* cited by examiner

*Primary Examiner*—Harry D Wilkins, III
(74) *Attorney, Agent, or Firm*—Thomas, Kayden, Horstemeyer & Risley

(57) ABSTRACT

A method of stabilizing plating film impurities in an electrochemical plating bath solution is disclosed. The method includes providing an electrochemical plating machine in which an electrochemical plating process is carried out. A by-product bath solution is formed by continually removing a pre-filtered bath solution from the machine and removing an additive from the pre-filtered bath solution. A clean bath solution is formed by removing an additive by-product from the by-product bath solution. An additive bath solution is formed by adding a fresh additive to the clean bath solution. The additive bath solution is added to the electrochemical plating machine. An apparatus for stabilizing film impurities in an electrochemical plating bath solution is also disclosed.

8 Claims, 3 Drawing Sheets

METHOD AND APPARATUS FOR STABILIZING PLATING FILM IMPURITIES

FIELD OF THE INVENTION

The present invention relates to electrochemical plating (ECP) processes used to deposit metal layers on semiconductor wafer substrates in the fabrication of semiconductor integrated circuits. More particularly, the present invention relates to ECP additives and a method and apparatus for stabilizing the quantity of additive by-product impurities in the electrochemical plating of metals, particularly copper, on a substrate.

BACKGROUND OF THE INVENTION

In the fabrication of semiconductor integrated circuits, metal conductor lines are used to interconnect the multiple components in device circuits on a semiconductor wafer. A general process used in the deposition of metal conductor line patterns on semiconductor wafers includes deposition of a conducting layer on the silicon wafer substrate; formation of a photoresist or other mask such as titanium oxide or silicon oxide, in the form of the desired metal conductor line pattern, using standard lithographic techniques; subjecting the wafer substrate to a dry etching process to remove the conducting layer from the areas not covered by the mask, thereby leaving the metal layer in the form of the masked conductor line pattern; and removing the mask layer typically using reactive plasma and chlorine gas, thereby exposing the top surface of the metal conductor lines. Typically, multiple alternating layers of electrically conductive and insulative materials are sequentially deposited on the wafer substrate, and conductive layers at different levels on the wafer may be electrically connected to each other by etching vias, or openings, in the insulative layers and filling the vias using aluminum, tungsten or other metal to establish electrical connection between the conductive layers.

Deposition of conductive layers on the wafer substrate can be carried out using any of a variety of techniques. These include oxidation, LPCVD (low-pressure chemical vapor deposition), APCVD (atmospheric-pressure chemical vapor deposition), and PECVD (plasma-enhanced chemical vapor deposition). In general, chemical vapor deposition involves reacting vapor-phase chemicals that contain the required deposition constituents with each other to form a nonvolatile film on the wafer substrate. Chemical vapor deposition is the most widely-used method of depositing films on wafer substrates in the fabrication of integrated circuits on the substrates.

Due to the ever-decreasing size of semiconductor components and the ever-increasing density of integrated circuits on a wafer, the complexity of interconnecting the components in the circuits requires that the fabrication processes used to define the metal conductor line interconnect patterns be subjected to precise dimensional control. Advances in lithography and masking techniques and dry etching processes, such as RIE (Reactive Ion Etching) and other plasma etching processes, allow production of conducting patterns with widths and spacings in the submicron range. Electrodeposition or electroplating of metals on wafer substrates has recently been identified as a promising technique for depositing conductive layers on the substrates in the manufacture of integrated circuits and flat panel displays. Such electrodeposition processes have been used to achieve deposition of the copper or other metal layer with a smooth, level or uniform top surface. Consequently, much effort is currently focused on the design of electroplating hardware and chemistry to achieve high-quality films or layers which are uniform across the entire surface of the substrates and which are capable of filling or conforming to very small device features. Copper has been found to be particularly advantageous as an electroplating metal.

Electroplated copper provides several advantages over electroplated aluminum when used in integrated circuit (IC) applications. Copper is less electrically resistive than aluminum and is thus capable of higher frequencies of operation. Furthermore, copper is more resistant to electromigration (EM) than is aluminum. This provides an overall enhancement in the reliability of semiconductor devices because circuits which have higher current densities and/or lower resistance to EM have a tendency to develop voids or open circuits in their metallic interconnects. These voids or open circuits may cause device failure or burn-in.

A typical standard or conventional electroplating system for depositing a metal such as copper onto a semiconductor wafer includes a standard electroplating cell having an adjustable current source, a bath container which holds an electrolyte electroplating bath solution (typically acid copper sulfate solution), and a copper anode and a cathode immersed in the electrolyte solution. The cathode is the semiconductor wafer that is to be electroplated with metal. Both the anode and the semiconductor wafer/cathode are connected to the current source by means of suitable wiring. The electroplating bath solution may include an additive for filling of submicron features and leveling the surface of the copper electroplated on the wafer. An electrolyte holding tank may further be connected to the bath container for the addition of extra electrolyte solution to the bath container, as needed.

In operation of the electroplating system, the current source applies a selected voltage potential typically at room temperature between the anode and the cathode/wafer. This potential creates a magnetic field around the anode and the cathode/wafer, which magnetic field affects the distribution of the copper ions in the bath. In a typical copper electroplating application, a voltage potential of about 2 volts may be applied for about 2 minutes, and a current of about 4.5 amps flows between the anode and the cathode/wafer. Consequently, copper is oxidized at the anode as electrons from the copper anode and reduce the ionic copper in the copper sulfate solution bath to form a copper electroplate at the interface between the cathode/wafer and the copper sulfate bath.

The copper oxidation reaction which takes place at the anode is illustrated by the following reaction equation: $Cu \text{ - - - >} Cu^{++} + 2e^-$ The oxidized copper cation reaction product forms ionic copper sulfate in solution with the sulfate anion in the bath 20:

At the cathode/wafer, the electrons harvested from the anode flowed through the wiring reduce copper cations in solution in the copper sulfate bath to electroplate the reduced copper onto the cathode/wafer:

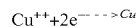

After the copper is electroplated onto the wafer, the wafer is frequently subjected to a CMP (chemical mechanical polishing) process to remove excess copper (copper overburden) from the electroplated copper layer and smooth the surface of the layer.

In an ECP process, an acidic copper electroplating bath solution typically includes various additives such as suppressors, accelerators and levelers. In order to meet 65-nm technology gap fill requirements, the additive concentrations are selected to achieve rapid bottom-up fill optimization in high aspect ratio vias and trenches, as well as microscopic and macroscopic uniformity. During the electroplating process, sulfur-containing additives form breakdown products in the electroplating solution. The presence of by-products in the electroplating solution is necessary for optimum wettability of the solution. However, excessive quantities of breakdown products in the solution during the electroplating process could become deposited in the copper film and cause defects in devices fabricated on the wafer. Accordingly, a novel apparatus and method is needed to stabilize the quantities of additive by-product impurities in an electroplating bath solution during an electroplating process.

SUMMARY OF THE INVENTION

The present invention is generally directed to a method for stabilizing the quantities of plating film impurities in an electroplating bath solution. The method includes providing a pre-filtered ECP (electrochemical plating) bath solution from an ECP machine, forming a by-product bath solution by removing additives from the pre-filtered bath solution, forming a clean bath solution by removing additive by-products from the bath solution, forming an additive bath solution by mixing fresh additive with the clean bath solution, and adding the additive bath solution to the ECP machine.

The present invention is further directed to a novel apparatus for stabilizing the quantity of additive by-product impurities in an electrochemical plating (ECP) bath solution during an ECP process. The apparatus includes a filter tank which is provided in fluid communication with an ECP machine and includes a receiving chamber for receiving a continuous flow of ECP bath solution from the machine during an electroplating process. An additive filter is provided in the filter tank for removing electroplating additives from the ECP bath solution. A by-product filter is provided in the filter tank, downstream of the additive filter, for removing additive by-products from the ECP bath solution. A re-circulation conduit re-circulates the filtered ECP bath solution back to the receiving chamber, where fresh additive is added to the solution. The filtered ECP bath solution with additive is then distributed to the ECP apparatus. Accordingly, excessive quantities of additive by-product are continually removed from the ECP bath solution to prevent the formation of defects in devices being fabricated on a wafer during the electroplating process.

BRIEF DESCRIPTION OF THE DRAWINGS

The invention will now be described, by way of example, with reference to the accompanying drawings, in which.

DETAILED DESCRIPTION OF THE INVENTION

Figure 1:
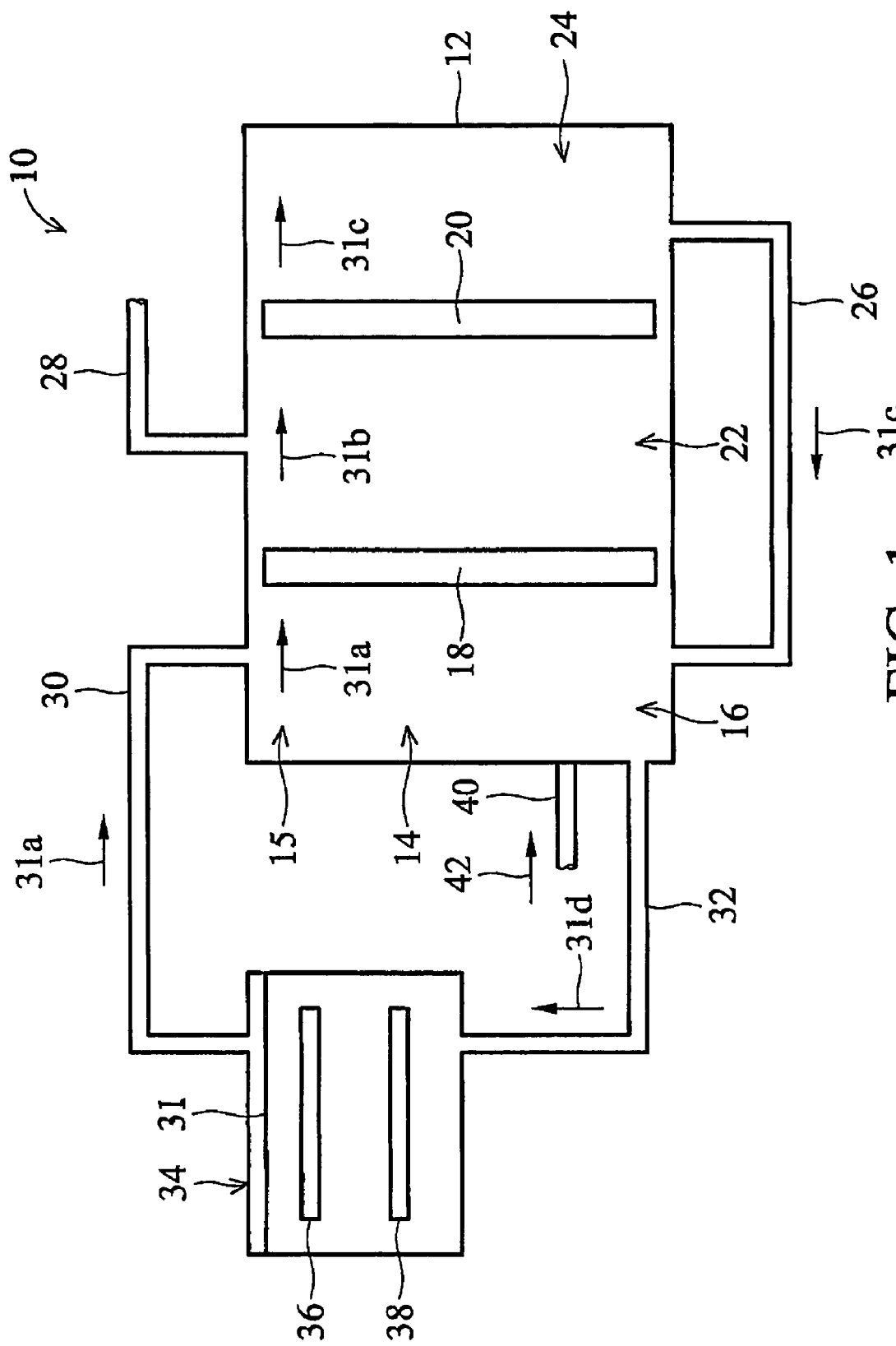
FIG. 1 is a schematic of a first embodiment of the apparatus for stabilizing plating film impurities of the present invention.

Referring initially to FIG. 1, an illustrative embodiment of an apparatus for stabilizing plating film impurities, hereinafter "apparatus", of the present invention is generally indicated by reference numeral 10. The apparatus 10 includes a filter tank 12 having a receiving chamber 14. The receiving chamber 14 typically has an upper portion 15 and a lower portion 16. An ECP (electrochemical plating) machine 34 is provided in fluid communication with the upper portion 15 of the receiving chamber 14 through a tank inlet conduit 30. An additive filter 18 separates the receiving chamber 14 from a middle chamber 22 in the filter tank 12. The additive filter 18 is preferably a non-woven fabric material which is capable of trapping particles having a molecular weight of typically greater than about 10,000.

A by-product filter 20 is provided in the filter tank 12 and separates the middle chamber 22 from a solution chamber 24. The by-product filter 20 is preferably a non-woven fabric material which is capable of trapping particles having a molecular weight of typically greater than about 1,000. A re-circulation conduit 26 connects the solution chamber 24 to the lower portion 16 of the receiving chamber 14. A drain conduit 28 typically extends from the middle chamber 22 for purposes which will be hereinafter described. A tank outlet conduit 32 connects the lower portion 16 of the receiving chamber 14 to the ECP machine 34. An additive conduit 40 is provided in fluid communication with the lower portion 16 of the receiving chamber 14, typically above the tank outlet conduit 32.

The ECP machine 34 may be a standard or conventional electroplating cell having a copper anode 38 and a cathode 36 immersed in an electrolyte electrochemical plating (ECP) bath solution 31. The cathode 36 is the semiconductor wafer that is to be electroplated with metal. Both the anode 38 and the semiconductor wafer/cathode 36 are connected to a current source (not shown) by means of suitable wiring. The ECP bath solution 31 typically includes sulfur-containing additives for the filling of submicron features and leveling the surface of the copper electroplated on the wafer 36. An electrolyte holding tank (not shown) may further be connected to the ECP machine 34 for the addition of extra electrolyte solution to the ECP machine 34, as needed.

In operation of the ECP machine 34, a selected voltage potential is applied typically at room temperature between the anode 38 and the cathode/wafer 36. This potential creates a magnetic field around the anode 38 and the cathode/wafer 3. The magnetic field affects the distribution of the copper ions in the ECP bath solution 31. Typically, a voltage potential of about 2 volts and a current of about 4.5 amps flows between the anode and the cathode/wafer for typically about 2 minutes. Consequently, copper is oxidized at the anode 38 as electrons from the copper anode 38 reduce the ionic copper in the ECP bath solution 31 to form a copper electroplate at the interface between the cathode/wafer 36 and the ECP bath solution 31.

During the electroplating process, the typically sulfer-containing additives in the ECP bath solution 31 break down into chemical by-products. The additive and by-product must be maintained at the critical micelle concentration (CMC) to achieve optimum wettability of the solution 31 on the wafer 36. If the concentration of the by-product in the ECP bath solution 31 rises above the CMC, the by-products have a tendency to contaminate device features being fabricated on the wafer 36. Therefore, the apparatus 10 is operated to remove the excess by-products from the ECP bath solution 31, thereby maintaining the additive and by-product in the ECP bath solution 31 at the CMC throughout the electroplating process.

Typical operation of the apparatus 10 is as follows. The ECP bath solution 31 is pumped from the ECP machine 34 as pre-filtered ECP bath solution 31a, which contains additives and by-products. The pre-filtered ECP bath solution 31 flows from the ECP machine 34, through the tank inlet conduit 30 and into the upper portion 15 of the receiving chamber 14. At a pressure of typically about 1~10 psi, the pre-filtered solution 31a flows from the receiving chamber 14 through the additive filter 18, forming a by-product bath solution 31b which flows through the middle chamber 22. The additive filter 18 removes the additives, which typically have a molecular weight of greater than about 10,000, from the solution 31a. The by-product bath solution 31b flows through the by-product filter 20 and into the solution chamber 24 of the filter tank 12. The by-product filter 20 removes the additive by-products, which typically have a molecular weight of greater than about 1,000, from the by-product bath solution 31b. Accordingly, the by-product bath solution 31b emerges from the by-product filter 20 as clean ECP bath solution 31c, which is pumped from the solution chamber 24, through the re-circulation conduit 26 and to the lower portion 16 of the receiving chamber 14. Excess by-product bath solution 31b can be drained from the system 10 through the drain conduit 28, as deemed necessary.

In the lower portion 16 of the receiving chamber 14, fresh additive 42 is added to the clean ECP bath solution 31c, typically through the additive conduit 40. Additive ECP bath solution 31d, having fresh additive 42 added thereto, is pumped from the lower portion 16 of the receiving chamber 14, through the tank outlet conduit 32 and back into the ECP machine 34. The ECP bath solution 31 is continually circulated from the ECP machine 34, through the apparatus 10 and back to the ECP machine 34 to remove excess additive by-product from the ECP bath solution 31 and maintain the additive and by-product at the critical micelle concentration in the solution 31. Furthermore, by-product contamination of devices being fabricated on the wafer 36 is prevented or substantially reduced.

Figure 2:
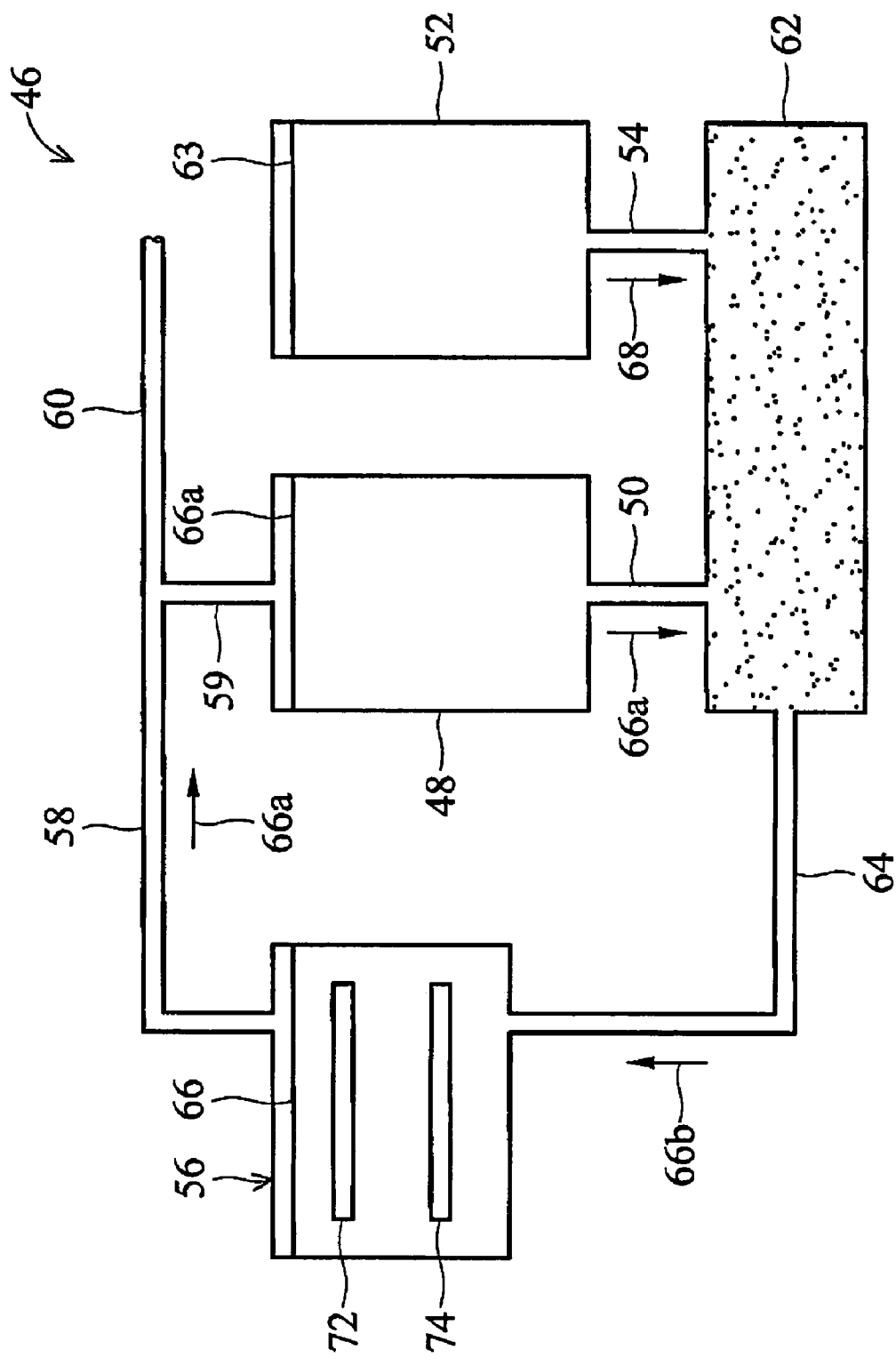
FIG. 2 is a schematic of a second embodiment of the apparatus for stabilizing plating film impurities of the present invention.

Referring next to FIG. 2, another embodiment of the apparatus of the present invention is generally indicated by reference numeral 46. The apparatus 46 includes an ECP bath solution conduit 58 which extends from an ECP machine 56 that may be conventional and contains an anode 74 and a cathode/wafer 72 immersed in an ECP electrolyte bath solution 66. An ECP bath solution conduit 58 extends from the ECP machine 56. A tank inlet conduit 59 branches from the ECP bath solution conduit 58, which may terminate in a drain conduit 60 beyond the tank inlet conduit 59. A holding tank 48 is provided in fluid communication with the tank inlet conduit 59. A distribution conduit 50 extends from the holding tank 48 and empties into a mixing tank 62. An additive tank 52, which contains a supply of additive 68, is provided in fluid communication with the mixing tank 62 through a distribution conduit 54. A mix tank outlet conduit 64 extends from the mixing tank 62 to the ECP machine 56.

During an electroplating process carried out in the ECP machine 56 to electroplate a typically copper layer (not shown) on the cathode/wafer 72, ECP bath solution 66 is continually pumped from the ECP machine 56 as ECP bath solution 66a, through the ECP bath solution conduit 58 and tank inlet conduit 59, respectively, and into the holding tank 48. Excess solution 66a can be drained from the system 46 through the drain conduit 60, as deemed necessary.

The solution 66a, which contains both additives and additive by-products resulting from the electroplating process, is distributed from the holding tank 48, through the distribution conduit 50 and into the mixing tank 62. Simultaneously, fresh additive 68 is distributed from the additive tank 52, through the distribution conduit 54 and into the mixing tank 62. In the mixing tank 62, the fresh additive 68 is added to and mixed with the solution 66a. ECP bath solution 66b, which contains the fresh additive 68, is then pumped from the mixing tank 62, through the mixing tank outlet conduit 64 and into the ECP machine 56. ECP bath solution 66 is continually circulated from the ECP machine 56, through the system 46 and back to the ECP machine 56 to maintain the additive and additive by-products at the critical micelle concentration (CMC) and ensure optimum wettability of the ECP bath solution 66 and prevent or minimize by-product contamination of devices being fabricated on the wafer 72.

Figure 3:
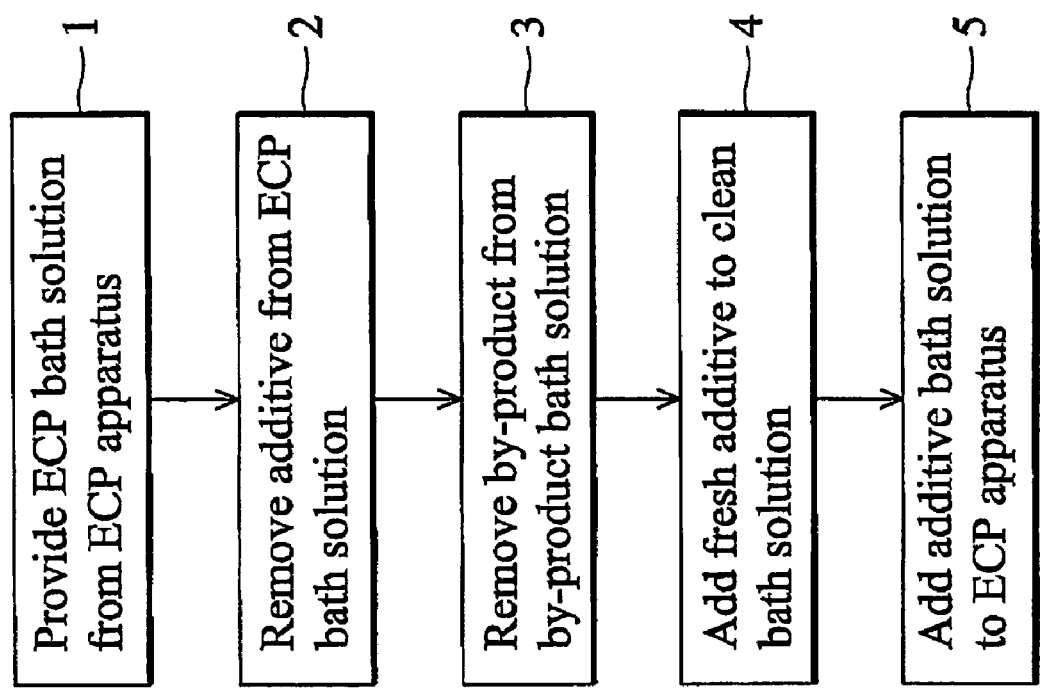
FIG. 3 is a flow diagram illustrating sequential process steps carried out according to the method for stabilizing plating film impurties of the present invention.

The flow diagram of FIG. 3 illustrates sequential process steps carried out according to the method for stabilizing plating film impurities according to the present invention. In step 1, an ECP bath solution from an ECP machine is provided. In step 2, additives are removed from the ECP bath solution to form a by-product bath solution. In step 3, additive by-products are removed from the by-product bath solution to form a clean bath solution. In step 4, fresh additive is added to the clean bath solution to form an additive bath solution. In step 5, the additive bath solution is added to the ECP apparatus.

While the preferred embodiments of the invention have been described above, it will be recognized and understood that various modifications can be made in the invention and the appended claims are intended to cover all such modifications which may fall within the spirit and scope of the invention.

What is claimed is:

1. An apparatus for stabilizing plating film impurities in an electrochemical plating machine, comprising:
    a filter tank for receiving a pre-filtered bath solution from the electrochemical plating machine, wherein said filter tank comprises a receiving chamber;
    an additive filter provided in said filter tank for removing additives from the bath solution, wherein a middle chamber is separated from said receiving chamber by said additive filter, and;
    a by-product filter provided in said filter tank for removing by-products from the bath solution, wherein a solution chamber is separated from said middle chamber by said by-product filter;
    an additive conduit provided in fluid communication with said filter tank for adding fresh additives to said bath solution; and
    a re-circulation conduit connecting said solution chamber to said receiving chamber for distributing the bath solution from said solution chamber to said receiving chamber.

2. The apparatus of claim 1 wherein said receiving chamber comprises an upper portion for receiving the pre-filtered bath solution and a lower portion spaced from said upper portion, and wherein said re-circulation conduit and said additive conduit are provided in fluid communication with said lower portion of said receiving chamber.

3. The apparatus of claim 2 further comprising a tank inlet conduit provided in fluid communication with said upper portion of said receiving chamber for distributing the pre-filtered bath solution from the electrochemical plating machine to said receiving chamber, and further comprising a tank outlet conduit provided in fluid communication with said lower portion of said receiving chamber for distributing the bath solution from said receiving chamber to the electrochemical plating machine.

4. The apparatus of claim 3 further comprising a drain conduit provided in fluid communication with said filter tank.

5. The apparatus of claim 1 wherein said additive filter is capable of removing additive particles having a molecular weight of greater than about 10,000 from the bath solution.

6. The apparatus of claim 1 wherein said by-product filter is capable of removing by-product particles having a molecular weight of greater than about 1,000 from the bath solution.

7. The apparatus of claim 1 wherein said additive filter is a non-woven fabric material.

8. The apparatus of claim 1 wherein said by-product filter is a non-woven fabric material.

* * * * *